United States Patent
Takai et al.

(10) Patent No.: US 10,598,740 B2
(45) Date of Patent: Mar. 24, 2020

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi (JP)

(72) Inventors: Yuki Takai, Nasushiobara (JP); Naoyuki Furudate, Otawara (JP); Masaaki Nagashima, Nasushiobara (JP); Yutaka Machii, Nasushiobara (JP)

(73) Assignee: Canon Medical Systems Corporation, Otawara-shi (JP)

(*) Notice: Subject to any disclaimer, the term of this patent is extended or adjusted under 35 U.S.C. 154(b) by 207 days.

(21) Appl. No.: 15/223,669

(22) Filed: Jul. 29, 2016

(65) Prior Publication Data

US 2017/0045590 A1    Feb. 16, 2017

(30) Foreign Application Priority Data

Aug. 10, 2015    (JP) ................. 2015-158581

(51) Int. Cl.
*G01R 33/00*    (2006.01)
*G01R 33/54*    (2006.01)
(Continued)

(52) U.S. Cl.
CPC ....... *G01R 33/0082* (2013.01); *G01R 33/022* (2013.01); *G01R 33/385* (2013.01); *G01R 33/3856* (2013.01); *G01R 33/543* (2013.01)

(58) Field of Classification Search
CPC .............. G01R 33/0082; G01R 33/022; G01R 33/3856; G01R 33/385; G01R 33/543
See application file for complete search history.

(56) References Cited

U.S. PATENT DOCUMENTS

2004/0017195 A1*   1/2004  Kassai ............... G01R 33/3856
                                                            324/315
2004/0169513 A1*   9/2004  Ham ................ G01R 33/56563
                                                            324/315
(Continued)

FOREIGN PATENT DOCUMENTS

EP         2508806 A2 * 10/2012 ......... F24D 19/1039
JP         11-318854         11/1999
(Continued)

OTHER PUBLICATIONS

Japanese Office Action dated Mar. 12, 2019 in Japanese Application No. 2015-158581, citing document AO, therein, 4 pages.

*Primary Examiner* — Huy Q Phan
*Assistant Examiner* — Zannatul Ferdous
(74) *Attorney, Agent, or Firm* — Oblon, McClelland, Maier & Neustadt, L.L.P.

(57) ABSTRACT

A magnetic resonance imaging apparatus according to an embodiment includes a temperature sensor and a processing circuit. The temperature sensor acquires a temperature. The processing circuit calculates, based on information on an imaging sequence in which magnetic resonance imaging is to be performed, an estimated value of consumption energy of a gradient coil in a case when the imaging sequence is executed and calculates, based on the temperature acquired by the temperature sensor and the estimated value of the consumption energy, an estimated value of a temperature of the gradient coil, the temperature of the gradient coil undergoing changes as the imaging sequence is executed.

12 Claims, 5 Drawing Sheets

(51) Int. Cl.
 *G01R 33/385* (2006.01)
 *G01R 33/022* (2006.01)

(56) References Cited

U.S. PATENT DOCUMENTS

2009/0140735 A1* 6/2009 Chen .................. G01R 33/383
 324/307
2013/0009641 A1 1/2013 Hori et al.

FOREIGN PATENT DOCUMENTS

| | | |
|---|---|---|
| JP | 2008-228765 | 10/2008 |
| JP | 2009-34479 | 2/2009 |
| JP | 2010-4910 | 1/2010 |
| JP | 2015-85137 | 5/2015 |

* cited by examiner

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2015-158581, filed on Aug. 10, 2015; the entire contents of which are incorporated herein by reference.

FIELD

Embodiments described herein relate generally to a magnetic resonance imaging apparatus and a magnetic resonance imaging method.

BACKGROUND

In magnetic resonance imaging, a failure of gradient coils may occur if the temperature of the gradient coils exceeds a predetermined limit temperature. In order to solve this problem, for example, a method is considered in which thermometers are installed in the gradient coils and the imaging sequence is discontinued if the measured temperature exceeds the limit temperature. Another method is considered in which an imaging sequence in which there is no concern as to the temperature of the gradient coil temperature exceeding the predetermined limit temperature is executed.

However, the former case is wasteful as the imaging sequence is all of a sudden discontinued when the temperature exceeds the limit. Furthermore, the latter method does not educe in full the potential endowed by the magnetic resonance imaging apparatus.

DETAILED DESCRIPTION

A magnetic resonance imaging apparatus according to an embodiment includes a temperature sensor and a processing circuit. The temperature sensor acquires a temperature. The processing circuit calculates, based on information on an imaging sequence in which magnetic resonance imaging is to be performed, an estimated value of consumption energy of a gradient coil in a case when the imaging sequence is executed and calculates, based on the temperature acquired by the temperature sensor and the estimated value of the consumption energy, an estimated value of a temperature of the gradient coil, the temperature of the gradient coil undergoing changes as the imaging sequence is executed.

A magnetic resonance imaging apparatus according to embodiments will be described in details below with reference to the accompanying drawings.

First Embodiment

Figure 1:
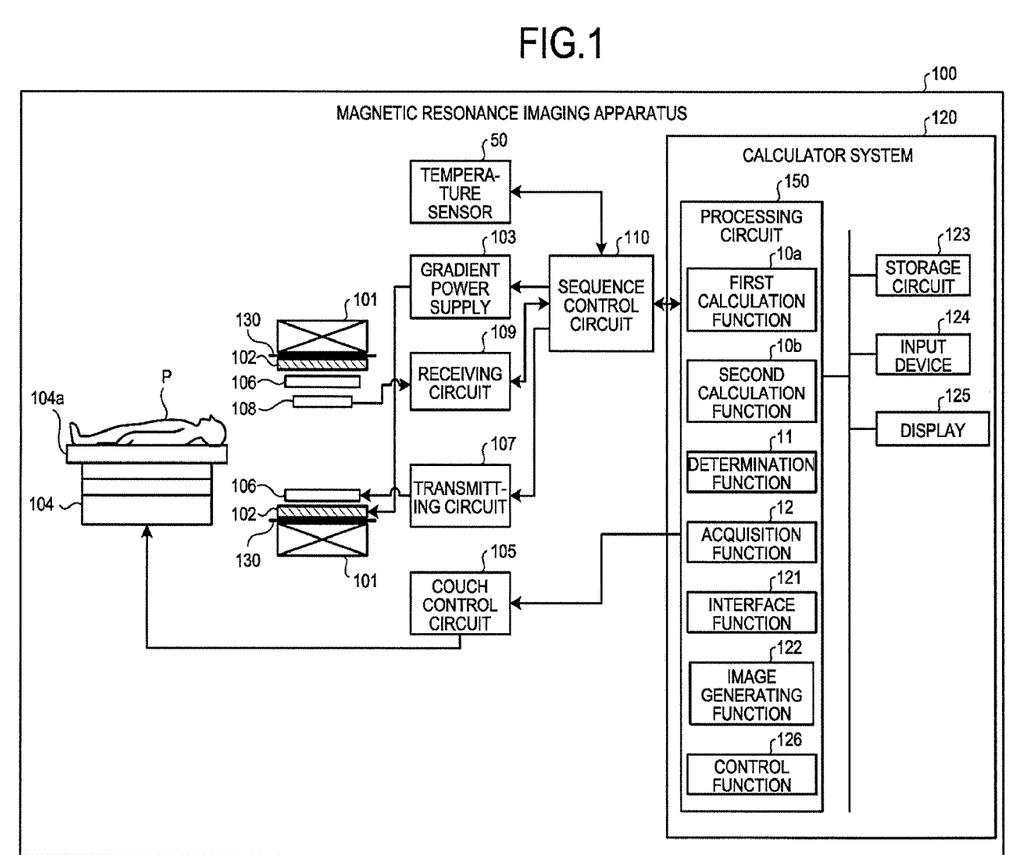
FIG. 1 is a block diagram illustrating a configuration of a magnetic resonance imaging apparatus 100 according to a first embodiment.

First, with reference to FIG. 1, an overall configuration of a magnetic resonance imaging apparatus 100 according to a first embodiment will be described. FIG. 1 is a block diagram illustrating a configuration of the magnetic resonance imaging apparatus 100 according to the first embodiment.

As illustrated in FIG. 1, a magnetic resonance imaging apparatus 100 includes a static field magnet 101, a shim coil 130, a gradient coil 102, a gradient power supply 103, a couch 104, a couch control circuit 105, a transmitting coil 106, a transmitting circuit 107, a receiving coil 108, a receiving circuit 109, a sequence control circuit 110, a temperature sensor 50, and a calculator system 120. The magnetic resonance imaging apparatus 100 does not include a subject P (for example, human body).

The static field magnet 101 is a hollow cylindrical magnet and produces a uniform static magnetic field in its internal space. The static field magnet 101 is, for example, a permanent magnet or a superconducting magnet.

The shim coil 130 is a hollow cylindrical coil formed on the inside of the static field magnet 101. The shim coil 120 is connected to a shim coil power supply not illustrated. The shim coil 120 makes the static magnetic field generated by the static field magnet 101 uniform, by the power supply supplied from the shim coil power supply.

The gradient coil 102 is a hollow cylindrical coil formed on the inside of the static field magnet 101 and disposed inside the shim coil 130. The gradient coil 102 is formed with a combination of three coils corresponding to the X, Y, and Z axes that are orthogonal to each other. These three coils individually receive currents from the gradient power supply 103 to produce gradient magnetic fields whose intensity changes according as the positions of the X, Y, and Z axes. The Z-axis direction is the same direction as the static magnetic field. The Y-axis direction is the vertical direction, and the X-axis direction is the direction perpendicular to the Z axis and the Y axis.

The X, Y, and Z-axis gradient magnetic fields produced by the gradient coil 102 form, for example, a gradient magnetic field for slice selection Gs, a gradient magnetic field for phase encoding Ge, and a gradient magnetic field for readout Gr. The gradient magnetic field for slice selection Gs is used to determine any given imaging plane. The gradient magnetic field for phase encoding Ge is used for changing the phase of the MR signal in accordance with a spatial position. The gradient magnetic field for readout Gr is used to change the frequency of the MR signal in accordance with the spatial position. Cooling apparatus not illustrated may be installed near the gradient coil 102. As an example of the coolant of the cooling apparatus, water is employed.

The gradient power supply 103 supplies currents to the gradient coil 102. This processing will be described later.

The couch 104 includes a couchtop 104a on which a subject P is placed. The couchtop 104a is inserted into the bore (imaging bore) of the gradient coil 102 with the subject P being placed thereon, under the control of the couch control circuit 105. The couch 104 is typically installed such that its longitudinal direction is parallel to the central axis of the static field magnet 101. The couch control circuit 105 drives the couch 104 to move the couchtop 104a in the longitudinal direction and the up/down direction under the control of the calculator system 120.

The transmitting coil 106 is disposed on the inside of the gradient coil 102 and is supplied with a radio frequency (RF) pulse from the transmitting circuit 107 to produce a high-frequency magnetic field. The transmitting circuit 107 supplies an RF pulse corresponding to the Larmor frequency to the transmitting coil 106. The Larmor frequency is determined by the kind of target nuclei and the intensity of the magnetic field.

The receiving coil 108 is disposed on the inside of the gradient coil 102 and receives an MR signal originated from the subject P under the influence of the high-frequency magnetic field. Upon receiving the MR signal, the receiving coil 108 outputs the received MR signal to the receiving circuit 109. For example, the receiving coil 108 is a coil array including one or more, typically, a plurality of, coil elements.

The receiving circuit 109 generates MR data based on the MR signal output from the receiving coil 108. Specifically, the receiving circuit 109 performs signal processing including pre-amplification, intermediate frequency conversion, phase detection, low frequency amplification, and filtering, on the MR signal output from the receiving coil 108. Thereafter, the receiving circuit performs analog-digital conversion on the processed data. The receiving circuit 109 thus generates MR data, which is digitalized complex data. The MR data generated by the receiving circuit 109 is also called raw data.

The receiving circuit 109 transmits the generated MR data to the sequence control circuit 110. The receiving circuit 109 may be included in the gantry including the static field magnet 101 and the gradient coil 102. In the first embodiment, the MR signals output from the coil elements in the receiving coil 108 are distributed and synthesized appropriately, thereby being output in units of channels, for example, to the receiving circuit 109. The MR data is thus handled for each channel in the processing of the receiving circuitry 109 or in the subsequent processing. The total number of channels may be equal to the total number of coil elements, or the total number of channels may be smaller than the total number of coil elements, or conversely, the total number of channels may be greater than the total number of coil elements. The timing of the distribution and the synthesis is not limited to the aforementioned timing. The MR signals or the MR data is distributed and synthesized in units of channels prior to the processing by the image generating function 122 by the processing circuit 150 to be described later.

The sequence control circuit 110 drives the gradient power supply 103, the transmitting circuit 107, and the receiving circuit 109 to image the subject P, based on information on an imaging sequence transmitted from the calculator system 120. The imaging sequence is a pulse sequence corresponding to each of a plurality of protocols included in an examination by the magnetic resonance imaging apparatus 100. The information of the imaging sequence includes, for example, the intensity of power supply supplied by the gradient power supply 103 to the gradient coil 102 and the timing for supplying power supply, the intensity of the RF pulse transmitted by the transmitting circuit 107 to the transmitting coil 106 and the timing for applying the RF pulse, and the timing at which the receiving circuit 109 detects the MR signal.

As a result of driving the gradient power supply 103, the transmitting circuit 107 and the receiving circuit 109, the shim coil power supply, and others to image the subject P, the sequence control circuit 110 receives MR data from the receiving circuit 109 and then transfers the received MR data to the calculator system 120.

The temperature sensor 50 is, for example, a thermometer for acquiring the temperature. The temperature sensor 50 acquires the temperature at a place where the temperature sensor 50 is installed, and then transmits temperature information to the sequence control circuit 110. The sequence control circuit 110 receives the temperature information from the temperature sensor 50 and then transmits the temperature information to the processing circuit 150 in the calculator system 120. The processing circuit 150 acquires, by the acquisition function 12, the temperature through the sequence control circuit 110. The temperature sensor 50 may be a non-contact thermometer such as an infrared thermometer or may be a contact thermometer such as a thermistor thermometer or a thermocouple thermometer.

The calculator system 120 performs, for example, central control of the magnetic resonance imaging apparatus 100, data acquisition, and image generation. The calculator system 120 includes the processing circuit 150, a storage circuit 123, an input device 124, and a display 125. The processing circuit 150 has a first calculation function 10a, a second calculation function 10b, a determination function 11, an acquisition function 12, an interface function 121, an image generating function 122, and a control function 126. The specific processing of the first calculation function 10a, the second calculation function 10b, and the determination function 11 will be described later.

In the first embodiment, the processing functions performed by the first calculation function 10a, the second calculation function 10b, the determination function 11, the acquisition function 12, the interface function 121, the image generating function 122, and the control function 126 are stored in the form of computer-executable programs in the storage circuit 123. The processing circuit 150 is a processor that reads out each program from the storage circuit 123 to implement the function corresponding to the program. In other words, the processing circuit 150 in a state of having read each program has the corresponding function illustrated in the processing circuit 150 in FIG. 1. In FIG. 1, a single processing circuit 150 implements the processing functions performed in the first calculation function 10a, the second calculation function 10b, the determination function 11, the acquisition function 12, the interface function 121, the image generating function 122, and the control function 126. However, a plurality of independent processors may be combined to configure the processing circuit 150, and each processor may execute a computer program to implement the corresponding function.

In other words, the functions described above are each configured as a program, and a single processing circuit may execute each program, or any particular function may be implemented in a dedicated independent program-executing circuit. The sequence control circuit 110, and the first calculation function 10a, the second calculation function 10b, the determination function 11, and the acquisition function 12 of the processing circuit 150 are an example of the sequence controller, the first calculation unit, the second calculation unit, the determination unit, and the acquisition unit, respectively.

The term "processor" used in the above description means, for example, a central processing unit (CPU), a graphical processing unit (GPU), or circuitry such as an application specific integrated circuit (ASIC) and a programmable logic device (for example, a simple programmable logic device (SPLD), a complex programmable logic device, and a field programmable gate array (FPGA)). The processor implements a function by reading and executing a computer program stored in the storage circuit 123.

A program may be directly built in a circuit in the processor, rather than storing a computer program in the storage circuit 123. In this case, the processor implements a function by reading and executing a computer program built in the circuit. It is noted that, the couch control circuit 105, the transmitting circuit 107, the receiving circuit 109, and the like are configured by an electronic circuit such as the processor as described above.

The processing circuit 150 transmits information on the imaging sequence to the sequence control circuit 110 by the interface function 121 and receives MR data from the sequence control circuit 110. Upon receiving MR data through the interface function 121, the processing circuit 150 stores the received MR data into the storage circuit 123.

The processing circuit 150 generates, by the image generating function 122, an image using MR data received through the interface function 121 and/or data stored in the storage circuit 123. The processing circuit 150 transmits the image obtained by the image generating function 122 to the display 125 and/or the storage circuit 123 as necessary.

The processing circuit 150 performs an overall control of the magnetic resonance imaging apparatus 100 by the control function 126. For example, the processing circuit 150 generates, by the control function 126, information of the imaging sequence, based on the imaging conditions input from the operator through the input device 124, and transmit the generated information of the imaging sequence to the sequence control circuit 110, thereby controlling imaging.

The storage circuit 123 stores, for example, MR data received by the processing circuit 150 through the interface function 121 and image data generated by the image generating function 122. The storage circuit 123 is, for example, a semiconductor memory device such as a random access memory (RAM) or a flash memory, a hard disk, or an optical disc.

The input device 124 accepts various instructions and information input from the operator. The input device 124 is, for example, a pointing device such as a mouse or a track ball, or an input device such as a keyboard.

The display 125 displays various types of information such as image data under the control of the control function 126 by the processing circuit 150. The display 125 is, for example, a display device such as a liquid crystal display.

Backgrounds on the magnetic resonance imaging apparatus 100 according to an embodiment will now be briefly described.

In magnetic resonance imaging, a rapid temperature increase of gradient coils may lead to a failure of the gradient coils. A possible method is, for example, to install a thermometer in the gradient coils and discontinue imaging when the temperature reaches a certain level or higher.

This method, however, is wasteful as the imaging is discontinued when the temperature reaches the certain level or higher. On the other hand, in a case in which the imaging is performed with a safety margin being secured so as not to have the imaging stopped, the performance of the magnetic resonance imaging apparatus 100 cannot be elucidated to the maximum. It is therefore preferable to calculate in advance a predicted value of temperature increase of the gradient coils for an imaging sequence, thereby adjusting the imaging sequence based on the calculation result.

A temperature increase value may be estimated from the consumed power of the gradient power supply. However, only a part of the consumed power of the gradient power supply is converted into the thermal energy, thereby contributing to the temperature increase. Given such a situation, it is difficult to accurately estimate the temperature increase value from the consumed power of the gradient power supply.

The processing circuit 150 then calculates, by the first calculation function 10a, an energy loss in the gradient power supply, using a predetermined circuit model. The processing circuit 150 then calculates, by the second calculation function 10b, an estimated value of the temperature of the gradient coil 102. The processing circuit 150 determines, by the determination function 11, whether the execution of the imaging sequence is acceptable, based on the estimated value of the temperature of the gradient coil 102.

In other words, the magnetic resonance imaging apparatus 100 according to the first embodiment has the processing circuit 150. The temperature sensor 50 (thus, the processing circuit 150) acquires a temperature. The processing circuit 150 calculates, by the first calculation function 10a, based on information on the imaging sequence in which magnetic resonance imaging is to be performed, a temporal change of the estimated value of consumption energy of the gradient coil in a case when the imaging sequence is executed. The processing circuit 150 calculates, by the second calculation function 10b, the estimated value of the temperature of the gradient coil at each time, based on the temperature acquired by the temperature sensor 50 and the estimated value of the consumption energy calculated. For example, the processing circuit 150 calculates, based on the temperature acquired by the temperature sensor 50 and the estimated value of the consumption energy, the estimated value of the temperature of the gradient coil, the temperature of the gradient coil undergoing changes as the imaging sequence is executed.

Figure 2:
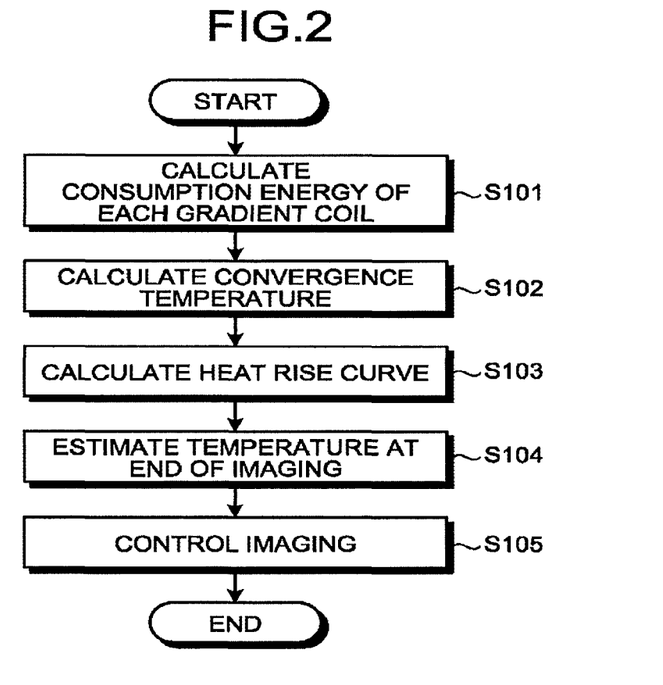
FIG. 2 is a flowchart illustrating the procedure of processing performed by the magnetic resonance imaging apparatus 100 according to the first embodiment.
Figure 3:
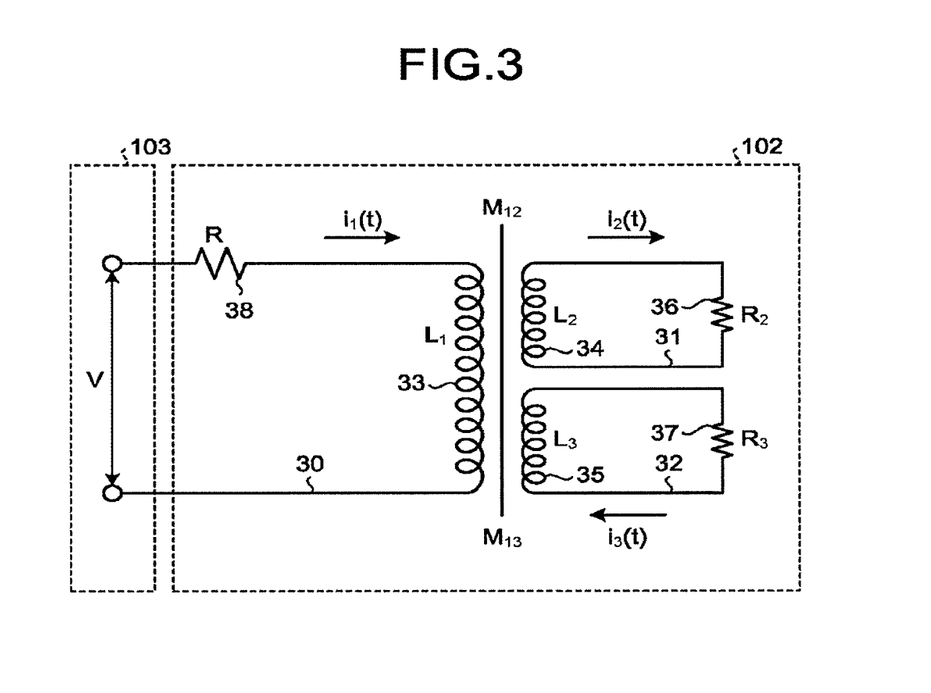
FIG. 3 is a diagram for explaining the processing performed by the magnetic resonance imaging apparatus according to the first embodiment.
Figure 4:
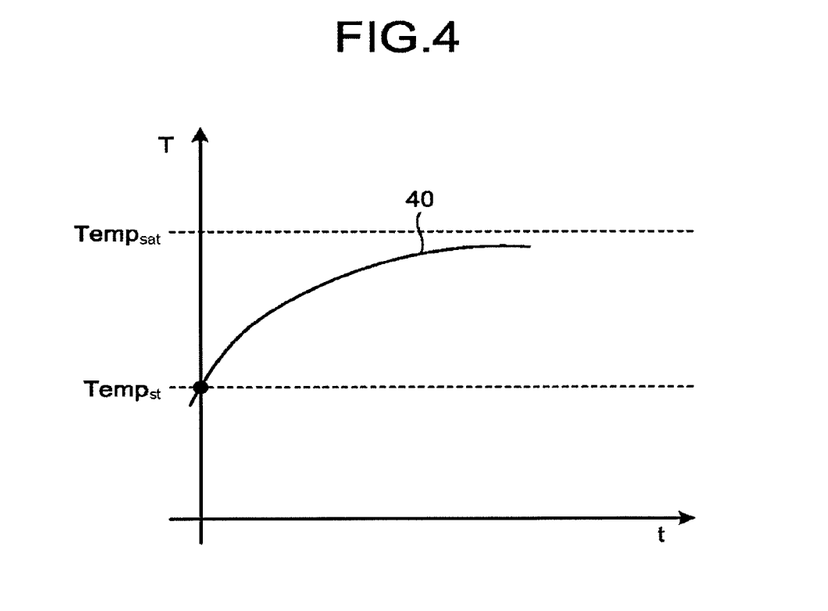
FIG. 4 are diagrams for explaining the processing performed by the magnetic resonance imaging apparatus 100 according to the first embodiment.

As for this point, a description will be given using FIG. 2 and, if necessary, with reference to FIG. 3 and FIG. 4. FIG. 2 is a flowchart illustrating the procedure of processing performed by the magnetic resonance imaging apparatus 100 according to the first embodiment. FIG. 3 and FIG. 4 are diagrams for explaining the processing performed by the magnetic resonance imaging apparatus 100 according to the first embodiment.

First of all, the processing circuit 150 calculates, by the first calculation function 10a, based on information on the imaging sequence, a temporal change of the estimated value of consumption energy of the gradient coil 102 in a case when the imaging sequence for performing magnetic resonance imaging is executed (step S101). For example, the processing circuit 150 estimates the consumption energy of the X, Y, and Z-axis gradient coils.

More specifically, as illustrated in FIG. 3, the processing circuit 150 construes, by the first calculation function 10a, a first circuit 30 connected to the gradient power supply 103 and having self-inductance and a second circuit including a closed circuit 31 and a closed circuit 32 having mutual inductance with the first circuit 30, as the equivalent circuit for the circuit including the gradient coil 102. First of all, the above-described point will be described briefly.

An equivalent circuit is a simplification of circuit elements having a complicated electrical property, transcribed as a combination of minimal number of elements representing the property. The processing circuit 150 transcribes the complicated electrical property of the gradient coil 102 as an equivalent circuit.

An example of the complicated electrical property of the gradient coil 102 is, for example, skin effect. As used herein, "skin effect" refers to an effect in which, when alternating current flows in a conductor, the current density is high on the surface of the conductor and the current density decreases as being away from the surface of the conductor. When high-frequency current flows through the conductor, due to the electromotive force originating from the mutual inductance within the conductor, electronic currents are screened, resulting in a decrease of the current density. Consequently, the electrical resistance increases, as the electrical density is concentrated on a shallow region extending to the extent of the skin depth in the case of alternating current. Typically, as the skin effect, the electrical resistance for alternating current increases, proportionally to the square root of the frequency. Another example of the complicated electrical property of the gradient coil 102 is heat loss due to eddy currents. An eddy current is an induced current generating within a conductor by a rapid change of the magnetic field. Eddy currents produced in a conductor are converted to Joule heat in the conductor, causing the gradient coil 102 to generate heat.

The circuit illustrated in FIG. 3 is an example of the equivalent circuit that symbolizes the electrical property of the gradient coil 102 to which the gradient power supply 103 applies voltage. The equivalent circuit including the gradient coil 102 includes, for example, a first circuit 30 and a second circuit that includes a closed circuit 31 and a closed circuit 32. The first circuit 30 includes a resistor 38 connected to the gradient power supply 103 and having a resistance value R, and a coil 33 having a self-inductance $L_1$. The closed circuit 31 includes a resistor 36 having a resistance value $R_2$, and a coil 34 having a self-inductance $L_2$. The closed circuit 32 includes a resistor 37 having a resistance value $R_3$, and a coil 35 having a self-inductance $L_3$. A mutual inductance $M_{12}$ is present between the coil 33 and the coil 34. A mutual inductance $M_{13}$ is present between the coil 33 and the coil 35.

The circuit equations for the closed circuit 31 and the closed circuit 32 are written as Equations (1) below:

$$L_2 \frac{di_2(t)}{dt} + R_2 i_2(t) = M_{12} \frac{di_1(t)}{dt} \quad (1)$$
$$L_3 \frac{di_3(t)}{dt} + R_3 i_3(t) = M_{13} \frac{di_1(t)}{dt}$$

where t is time; $i_1(t)$ is current flowing through the first circuit 30; $i_2(t)$ is current flowing through the closed circuit 31; and $i_3(t)$ is current flowing through the closed circuit 32.

The effect given by the closed circuit 31 and the closed circuit 32 on the first circuit 30 through the mutual inductance is the effect of high-order perturbation of the current $i_1(t)$ flowing through the first circuit 30 and is thus generally small and, for example, can be neglected.

Current $i_1(t)$ is the amount corresponding to the waveform of the pulse sequence of a gradient magnetic field. That is, the change of the waveform of the pulse sequence is a temporal change of the current $i_1(t)$.

Subsequently, the processing circuit 150 then calculates, by the first calculation function 10a, the values of currents ($i_2(t)$ and $i_3(t)$) flowing through the closed circuit 31 and the closed circuit 32, based on the information on the imaging sequence.

Specifically, Equations (1) are first-order linear differential equations with respect to t and can be solved for a functional system of any given current $i_1(t)$, and current $i_2(t)$ and current $i_3(t)$ can be expressed as functions of current $i_1(t)$.

For example, when current $i_1(t)$ has a value $i_0$ at time t=0 and the current value increases at a constant rate, current $i_1(t)$ is expressed by Equation (2) below.

$$i_1(t) = At + i_0 \quad (2)$$

In this case, the differential equation is solved, and then current $i_2(t)$ and current $i_3(t)$ are expressed by Equations (3) below.

$$i_2(t) = \frac{AM_{12}}{R_2}\left[1 - e^{-\frac{R_2}{L_2}t}\right] + i_2(0)e^{-\frac{R_2}{L_2}t} \quad (3)$$
$$i_{3(t)} = \frac{AM_{13}}{R_3}\left[1 - e^{-\frac{R_3}{L_3}t}\right] + i_3(0)e^{-\frac{R_3}{L_3}t}$$

The processing circuit 150 thus can calculate the values of currents flowing through the closed circuit 31 and the closed circuit 32, using Equations (3).

The processing circuit 150 then calculates, by the first calculation function 10a, a temporal change of the estimated value of consumption energy of the gradient coil 102, based on the calculated current value.

Specifically, the processing circuit 150 calculates the amount of Joule heat consumed in the equivalent circuit at each time, as the estimated value of the consumption energy of the gradient coil 102. Here, in the resistor 38 in the first circuit 30, and in the resistor 36 in the closed circuit 31, and in the resistor 37 in the closed circuit 32, the energy is consumed. It is often the case that the resistance of the resistor 38 is often designed to be small. The processing circuit 150 therefore, for example, mainly taking consumption energy $E_2(t)$ in the closed circuit 31 and consumption energy $E_3(t)$ in the closed circuit 32 into consideration, thereby calculating the estimated value E(t) of consumption energy of the gradient coil 102 at each time, as illustrated by Equation (4).

$$E(t) = E_2(t) + E_3(t) \quad (4)$$
$$= R_2 i_2(t)^2 + R_3 i_3(t)^2$$

The processing circuit 150 thus can calculate the temporal change of the estimated value of the consumption energy of the gradient coil 102, by the first calculation function 10a.

As for the circuit configuration of the equivalent circuit, the above-described configuration is only an example. Embodiments are not limited to the example described above. For example, the number of closed circuits is not limited to two but may be, for example, one or three. The processing circuit 150 may use a circuit including capacitors as the equivalent circuit in order to incorporate effects such as dielectric loss. In the example described above, the processing circuit 150 uses the equations for the closed circuits alone. However, the processing circuit 150 may use the equation for the first circuit.

The processing circuit 150 then acquires, through the acquisition function 12, a temperature (initial temperature). Specifically, the processing circuit 150 acquires, from the temperature sensor 50 set at a predetermined position, a temperature (initial temperature) at the predetermined position, by the sequence control circuit 110. The predetermined position may be a position in the inside of the magnetic resonance imaging apparatus 100 or may be a position on the outside of the magnetic resonance imaging apparatus 100. The processing circuit 150 then calculates, by the second calculation function 10b, the estimated value of the convergence temperature, based on the initial temperature acquired by the temperature sensor and the estimated value of the consumption energy calculated by the first calculation function 10a at step S101 (step S102). As used herein, the convergence temperature is the temperature to which the temperature converges at the predetermined position after a sufficient time has elapsed (after an infinite time has elapsed) when the imaging sequence is kept executed. At the convergence temperature, a thermally steady state is reached between the gradient coil 102 and the outside air, the cooling apparatus, and the like. That is, at the convergence temperature, the energy flowing in per unit time through the heat generation by the gradient coil 102 is in equilibrium to the energy flowing out per unit time through the discharge of heat to the outside.

The processing circuit 150 calculates, by the second calculation function 10b, the convergence temperature, based on the magnitude of the interaction between the conductor patterns of the X-axis, the Y-axis, and the Z-axis of the gradient coil 102.

Such a situation is illustrated, for example, by Equation (5).

$$\begin{bmatrix} Temp_{sat\_a} \\ Temp_{sat\_b} \\ Temp_{sat\_c} \end{bmatrix} = \alpha \times \begin{pmatrix} \beta_{11} & \beta_{12} & \beta_{13} \\ \beta_{21} & \beta_{22} & \beta_{23} \\ \beta_{31} & \beta_{32} & \beta_{33} \end{pmatrix} \times \begin{bmatrix} E_x \\ E_y \\ E_z \end{bmatrix} - \begin{bmatrix} Temp_{def\_a} \\ Temp_{def\_b} \\ Temp_{def\_c} \end{bmatrix} \quad (5)$$

The processing circuit 150 calculates, by the second calculation function 10b, the convergence temperatures $Temp_{sat\_a}$, $Temp_{sat\_b}$, and $Temp_{sat\_c}$ at temperature estimation positions a, b, and c by evaluating the right side of Equation (5).

The temperature estimation positions a, b, and c are positions at which the temperature is estimated, and three different positions are selected in the example of Equation (5). $E_x$, $E_y$, and $E_z$ are the estimated values of energy consumption of the X-axis, the Y-axis, and the Z-axis respectively, of the gradient coil 102. The matrix $\beta=\{\beta ij\}$ (i=1 to 3, j=1 to 3) is a matrix whose elements are predetermined coefficients specified based on the arrangement of the axes of the gradient coil 102. Here, the matrix $\beta$ is a quantity that represents the magnitude of interaction between the conductor patterns of the X-axis, the Y-axis, and the Z-axis of the gradient coil 102. The coefficient $\alpha$ is a coefficient that represents the magnitude of contribution of the temperature increase at a temperature estimation position with respect to the energy consumption of the gradient coil 102. That is, the larger the coefficient $\alpha$ is, the more likely each temperature estimation position is to be affected by the gradient coil 102. Conversely, the smaller the coefficient $\alpha$ is, the less likely each temperature estimation position is to be affected by the gradient coil 102. The coefficient $\alpha$ varies with the output current waveform of a gradient magnetic field and/or the output current ratios of the X-axis, the Y-axis, and the Z-axis of the gradient coil 102. $Temp_{def}$ is the initial temperature acquired by the temperature sensor 50. The initial temperature is a temperature of the gradient coil 102 in an unloaded state and depends on the capability of the cooling apparatus.

The meaning of Equation (5) will be described briefly. The left side of Equation (5) is the estimated values of the convergence temperature at the temperature estimation positions. The right side of Equation (5) is obtained by adding the initial temperatures to the estimated values of temperature increase at the temperature estimation positions. The estimated values of temperature increase at the temperature estimation positions are obtained by multiplying the coefficient $\alpha$, which represents the magnitude of contribution of temperature increase at a temperature estimation position to consumption energy of the gradient coil 102, the matrix $\beta$, which represents the magnitude of interaction between the conductor patterns of the gradient coil 102 of the X-axis, the Y-axis, and the Z-axis, and the estimated values $E_x$, $E_y$, and $E_z$ of consumption energy of the gradient coil 102 of the X-axis, the Y-axis, and the Z-axis.

In other words, the processing circuit 150 calculates, by the second calculation function 10b, the estimated value of temperature increase, based on a linear sum of the estimated values of consumption energy of the X-axis, the Y-axis and the Z-axis gradient coils 102 and certain coefficients specified based on the arrangement of the gradient coils 102 of the axes, and to calculate the estimated value of the convergence temperature based on the estimated value of the temperature increase.

It is noted that, by using the matrix $\beta$, the processing circuit 150 can calculate the convergence temperature, for example, in a case when current is simultaneously supplied to both of the gradient coil 102 of the X-axis and the Y-axis. The matrix $\beta$ is thus not to strictly find the interaction between the conductor patterns for each of the axes of the coil, as in the heat equation, but is thought to reflect the interaction between the conductor patterns for each of the axes of the coil, in a sense that the matrix $\beta$ is a coefficient group obtained, for example, based on experimentally obtained data.

As an example of the specific representation of the matrix $\beta$, for example, the processing circuit 150 may set a coefficient inversely proportional to the second power of the distance between each temperature estimation position and the position of each axis of the gradient coil 102, as a coefficient of the matrix $\beta$. This is, for example, based on a fact that the amount of heat in which heat that is pertinent to a heat source passes through a predetermined surface per unit time is inversely proportional to the square of the distance from the heat source, the heat source having a predetermined source Q at a predetermined position As another example of the specific representation of the matrix $\beta$, the processing circuit 150 may specify a specific representation of the matrix $\beta$ based on the temperature information obtained from the temperature sensor 50, in which case the position of the temperature sensor 50 is set as each temperature estimation position.

In the example described above, the processing circuit 150 estimates, by the second calculation function 10b, the temperatures at three points set as the temperature estimation positions. Embodiments, however, are not limited to this example. For example, the processing circuit 150 may estimate, by the second calculation function 10b, the temperatures at temperature estimation positions of two, four, five, or ten points.

The processing circuit 150 then calculates, by the second calculation function 10b, a heat rise curve, based on the calculated estimated value of the convergence temperature (step S103). The processing circuit 150 calculates, by the second calculation function 10b, a heat rise curve, for example, using a mathematical expression illustrated by Equation (6).

$$\text{Temp} = (\text{Temp}_{sat} - \text{Temp}_{st})(1 - e^{-\alpha * Time}) + \text{Temp}_{st} \quad (6)$$

In Equation (6), $\text{Temp}_{st}$ is an imaging initiation temperature, which is the temperature at the start of the imaging sequence. Time represents a time. $\alpha$ represents the inverse of the time constant in which the temperature exponentially approaches toward the convergence temperature. That is, $\alpha$ represents the rate at which the temperature exponentially approaches toward the convergence temperature. $\text{Temp}_{sat}$ represents the convergence temperature. Temp represents the temperature at a time Time.

Equation (6) is derived from, for example, the heat equation. Equation (6) indicates that the temperature of the gradient coil 102 changes with time so as to exponentially approach toward the convergence temperature. FIG. 4 is a graph illustrating the behavior of Equation (6). The vertical axis of the graph represents the temperature and the horizontal axis represents the time. The graph 40 illustrates the estimated value of the temperature of the gradient coil 102 at each time. At t=0, the temperature of the gradient coil 102 is the imaging initiation temperature $\text{Temp}_{st}$. At t=∞, the temperature of the gradient coil 102 is the convergence temperature $\text{Temp}_{sat}$. At 0<t<∞, the temperature of the gradient coil 102 exponentially approaches toward the convergence temperature $\text{Temp}_{sat}$.

That is, the processing circuit 150 calculates, by the second calculation unit 10b, the estimated value of the temperature of the gradient coil 102 at each time, based on the estimated value of the convergence temperature $\text{Temp}_{sat}$. In other words, the processing circuit 150 calculates, by the second calculation function 10b, the estimated value of the temperature of the gradient coil 102 at each time, based on the magnitude of the interaction between the conductor patterns of the gradient coil 102 of the X-axis, the Y-axis, and the Z-axis, by the processing at the step S102 and step S103.

The processing circuit 150 then calculates the estimated value of temperature at the point of time when execution of the imaging sequence is finished (step S104). The processing circuit 150 calculates the estimated value of the temperature at a point of time when the execution of the imaging sequence is finished, for example, by substituting a predetermined time in Equation (6).

The processing circuit 150 then determines, by the determination function 11, prior to the execution of the imaging sequence, whether it is acceptable to execute the imaging sequence or not. As an example, if the convergence temperature $\text{Temp}_{sat}$ is lower than a predetermined temperature (limit temperature for imaging $\text{Temp}_{lim}$), the processing circuit 150 determines that, by the determination function 11, it is acceptable to execute the imaging sequence. As another example, if the estimated value of the temperature at the point of time when the execution of the imaging sequence is finished is lower than a predetermined temperature (limit temperature for imaging $\text{Temp}_{lim}$), the processing circuit 150 determines that, by the determination function 11, it is acceptable to execute the imaging sequence.

The processing circuit 150 then controls imaging, based on the result of determination by the determination function 11 (step S105). Specifically, when the processing circuit 150 determines that, by the determination function 11, the execution of the imaging sequence is acceptable, the processing circuit 150 transmits a control signal for executing the imaging sequence to the sequence control circuit 110. When the processing circuit 150 determines that, by the determination function 11, it is acceptable to execute the imaging sequence, the sequence control circuit 110 receiving the control signal executes the imaging sequence. When it is determined that the execution of the imaging sequence is acceptable, the processing circuit 150 accepts a change in imaging conditions from the user without any limitation and transmits a control signal corresponding to the accepted imaging conditions to the sequence control circuit 110.

By contrast, when the processing circuit 150 determines that, by the determination function 11, the execution of the imaging sequence is not acceptable, the processing circuit 150 causes the display 125 to display the result of determination and requests the user to reset the imaging conditions through the input device 124. For example, the processing circuit 150 requests a resetting of an imaging condition in which the estimated value of the temperature at the point of the completion of the execution of the imaging sequence does not exceed the limit temperature for imaging $\text{Temp}_{lim}$, the estimated value of the temperature being calculated from the imaging condition subsequent to the resetting. Upon accepting resetting of the imaging conditions from the user through the input device 124, the processing circuit 150 performs the processing from step S101 to step S105 again in accordance with the accepted imaging conditions. The processing circuit 150 repeats the processing from step S101 to step S105 until the processing circuit 150 determines that the execution of the imaging sequence is acceptable by the determination function 11 As another example, when the processing circuit 150 determines by the determination function 11 that the execution of the imaging sequence is not acceptable, the processing circuit 150 causes the display 125 to display the result of determination. The processing circuit 150 also acquires the temperature through the temperature sensor 50. The processing circuit 150 does not perform imaging while the temperature acquired from the temperature sensor 50 is higher than the temperature at which imaging is possible. The user waits until the temperature acquired from the temperature sensor 50 reaches the temperature at which imaging is possible.

In this case, the sequence control circuit 110 executes the imaging sequence after a wait time for keeping the user waiting has elapsed. The processing circuit 150 may display the duration of the wait time to the user by the display 125.

When the sequence control circuit 110 executes the imaging sequence, the processing circuit 150 generates, through the image generating function 122, a medical image based on the executed imaging sequence.

The magnetic resonance imaging apparatus 100 according to the first embodiment can estimate a temperature increase value prior to the execution of the imaging sequence. It is thus determined whether the temperature exceeds the limit temperature for imaging prior to the execution of the imaging sequence. If it is determined that the execution of the imaging sequence does not cause the temperature to exceed the limit temperature for imaging, the magnetic resonance imaging apparatus 100 executes the imaging sequence without change. By contrast, if it is determined that the execution of the imaging sequence causes the temperature to exceed the limit temperature for imaging, the magnetic resonance imaging apparatus 100 changes the parameters concerning the imaging sequence. This processing allows the user to smoothly perform magnetic resonance imaging without being hindered by the suspension of imaging due to the temperature increase. In addition, the magnetic resonance imaging apparatus 100 according to the first embodiment can tailor output of the gradient power supply 103 for various types of sequences. The user can grasp a temperature increase value even for a sequence that requires a large gradient magnetic field intensity, thereby maximizing the performance and the imaging time of the imaging sequence.

Second Embodiment

In the example in the first embodiment described above, the processing circuit 150 calculates, by the second calculation function 10b, the estimated value of the convergence temperature $Temp_{sat}$ and calculates the estimated value of the temperature of the gradient coil 102 at each time, based on the calculated estimated value. In a second embodiment, the processing circuit 150 also calculates the estimated value of the temperature of the gradient coil 102 at each time in the same manner as in the first embodiment, but utilizes the estimated value to a different situation. The magnetic resonance imaging apparatus 100 according to the second embodiment may have the same configuration as the magnetic resonance imaging apparatus 100 according to the first embodiment, except for the configuration explicitly illustrated otherwise. A detailed description of the same part of the configuration in the first embodiment and the second embodiment will be omitted.

The magnetic resonance imaging apparatus 100 according to the second embodiment has the same configuration as the magnetic resonance imaging apparatus 100 according to the first embodiment. Further, the processing circuit 150 calculates the time since the temperature of the gradient coil 102 is the acceptable temperature for starting the imaging until the temperature of the gradient coil 102 reaches the limit temperature for imaging, based on the initial temperature and a temporal change of the estimated value of the consumption energy.

Figure 5:
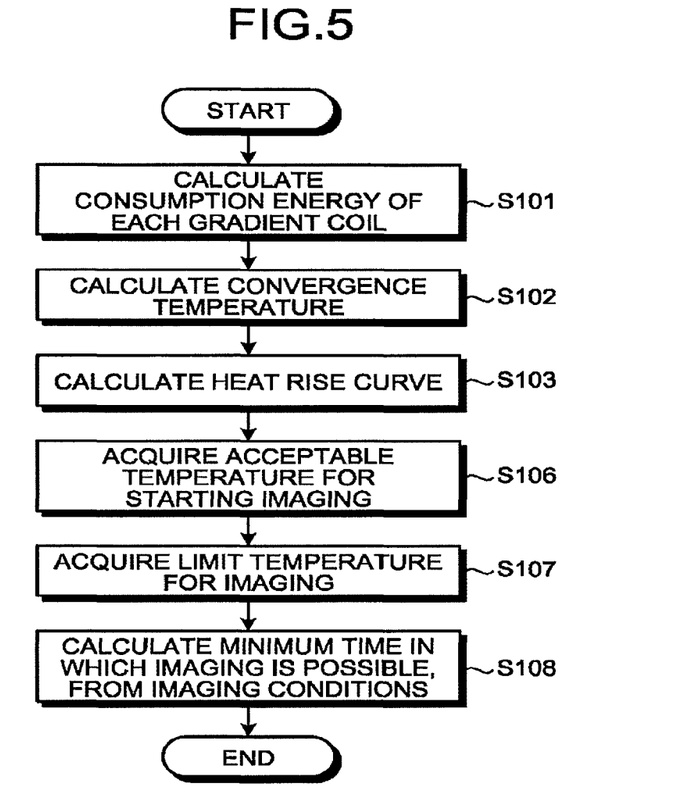
FIG. 5 is a flowchart illustrating the procedure of processing performed by the magnetic resonance imaging apparatus 100 according to a second embodiment.
Figure 6:
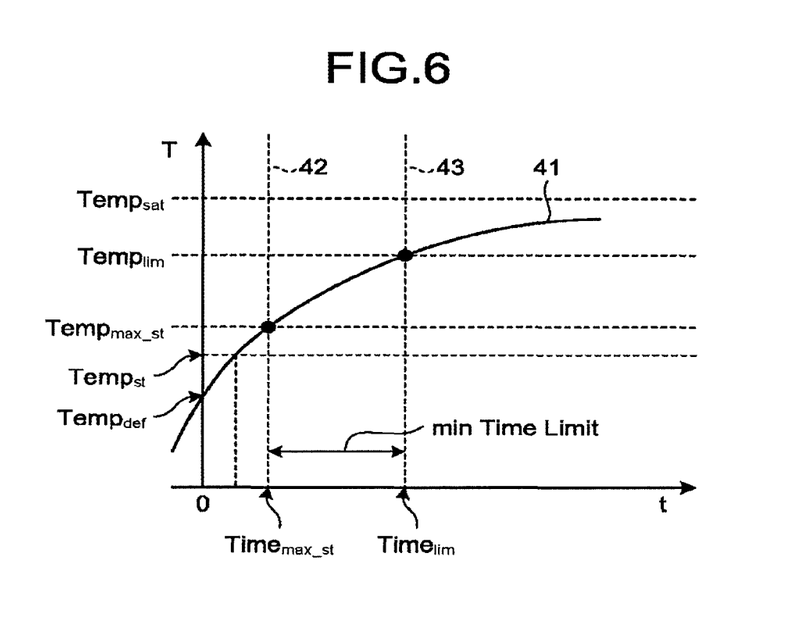
FIG. 6 is a diagram for explaining the processing performed by the magnetic resonance imaging apparatus 100 according to the second embodiment.

In this respect, an explanation is given using FIG. 5 and, if necessary, with reference to FIG. 6. FIG. 5 is a flowchart illustrating the procedure of processing performed by the magnetic resonance imaging apparatus 100 according to the second embodiment. FIG. 6 is a diagram for explaining the processing performed by the magnetic resonance imaging apparatus 100 according to the second embodiment.

The processing circuit 150 calculates, by the first calculation function 10a, the consumption energy of the gradient coil 102 in the same manner as in the first embodiment (step S101). The processing circuit 150 calculates, by the second calculation function 10b, the convergence temperature (step S102) and the heat rise curve (step S103). These steps are the same as in the first embodiment, and a detailed description thereof will be omitted.

By the second calculation function 10b, the processing circuit 150 acquires an acceptable temperature for starting the imaging as a first temperature $Temp_{max\_st}$, for example, from the user through the input device 124, the acceptable temperature for starting the imaging being a predetermined temperature specified as the maximum temperature at which an imaging sequence can be started (step S106). By the second calculation function 10b, the processing circuit 150 acquires, a limit temperature for imaging as a second temperature $Temp_{lim}$, for example, from the user through the input device 124, the limit temperature for imaging being a predetermined temperature specified as the maximum temperature at which an imaging sequence can be continued (step S107). The processing circuit 150 then calculates, by the second calculation function 10b, the time since the gradient coil 102 is the first temperature (the acceptable temperature for starting the imaging) until the gradient coil 102 reaches the second temperature (the limit temperature for imaging), based on the initial temperature acquired by the temperature sensor 50 and a temporal change of the estimated value of the consumption energy calculated by the first calculation function 10a (step S108).

Specifically, the processing circuit 150 calculates, by the second calculation function 10b, the time since the first temperature until the second temperature, based on Equations (7 to 9).

$$\min \text{Time Limit} = \text{Time}_{lim} - \text{Time}_{max\_st} \quad (7)$$

$$\text{Time}_{lim} = -\ln(1 - \text{Temp}_{lim}/\text{Temp}_{sat})/\alpha \quad (8)$$

$$\text{Time}_{max\_st} = -\ln(1 - \text{Temp}_{max\_st}/\text{Temp}_{sat})/\alpha \quad (9)$$

The left side minTimeLimit of Equation (7) represents the time taken for the gradient coil 102 to reach the second temperature (limit temperature for imaging) from the first temperature (acceptable temperature for starting the imaging). This quantity can be expressed by the difference between the two quantities $\text{Time}_{lim}$ and $\text{Time}_{max\_st}$ on the right side of Equation (7). The formulae of $\text{Time}_{lim}$ and $\text{Time}_{max\_st}$ are illustrated by Equation (8) and Equation (9), respectively. Here, $\text{Temp}_{sat}$ is the convergence temperature. $\text{Temp}_{max\_st}$ is the acceptable temperature for starting the imaging (first temperature), which is a predetermined temperature determined as the maximum temperature on which the imaging sequence can be initiated. $\text{Temp}_{lim}$ is the limit temperature for imaging (second temperature), which is a predetermined temperature determined as the maximum temperature on which an imaging sequence can be continued.

Such a situation is illustrated in FIG. 6. FIG. 6 is a diagram for explaining Equations (7) to (9). FIG. 6 illustrates a temperature change curve 41 of the gradient coil 102, in which the horizontal axis represents the time and the vertical axis represents the temperature. The temperature of the gradient coil 102 exponentially approaches toward the convergence temperature $\text{Temp}_{sat}$ in accordance with Equation (6) above as the time t passes. The temperature of the gradient coil 102 is the acceptable temperature for starting the imaging (first temperature) at the time represented by the straight line 42. The temperature of the gradient coil 102 is the limit temperature for imaging (second temperature) at the time represented by the straight line 43. The time minTimeLimit from the first temperature to the second temperature is thus the difference between the time represented by the straight line 43 and the time represented by the straight line 42 in FIG. 6. (It is noted that if $\text{Temp}_{sat} < \text{Temp}_{lim}$, the system temperature does not reach $\text{Temp}_{lim}$ for good. The processing circuit 150 therefore sets the value of minTimeLimit to "infinity". Alternatively, the processing circuit 150 sets the value of minTimeLimit to a predetermined length of time (for example, 15 minutes).

The time $\text{Time}_{lim}$ represented by the straight line 43 can be obtained by substituting $\text{Temp} = \text{Temp}_{lim}$ in the left side of Equation (6) and solving for Time. The time $\text{Time}_{max\_st}$ represented by the straight line 42 can be obtained by substituting $\text{Temp} = \text{Temp}_{max\_st}$ in the left side of Equation (6) and solving for Time. The processing circuit 150 calculates, by the second calculation function 10b, the time from the first temperature to the second temperature in the form of Equations (7 to 9) by obtaining the difference between the time represented by the straight line 43 and the time represented by the straight line 42.

The implication of the first temperature is as follows. Now let us consider a case where active shimming is performed. Shimming is performed in the vicinity of the initial temperature $Temp_{def}$ and may be performed at a high temperature or performed at a low temperature, depending on various conditions. In executing the imaging sequence, if the temperature on which the imaging is started is near the initial temperature, there is not much of a problem. However, if the temperature on which the imaging is started is considerably higher than the initial temperature, the deviation from the suitable temperature for shimming becomes large and non-uniformity in a magnetic field appears, leading to the degradation of the image quality. In order to prevent the degradation of the image quality, the sequence control circuit 110 does not start the imaging when the temperature on which the imaging is started is higher than the acceptable temperature for starting the imaging (the first temperature). Consequently, as for the case in which the imaging sequence is to be executed and the imaging is started, it is guaranteed that the temperature is lower than the acceptable temperature for starting the imaging (the first temperature)

The implication of the second temperature is as follows. If the temperature exceeds the limit temperature for imaging (second temperature), which is a predetermined temperature specified as the maximum temperature at which the imaging sequence can be continued, for example, the gradient coil 102 and the like may malfunction. Therefore, it is no longer acceptable for the sequence control circuit 110 to continue the imaging sequence at such a temperature. In this case, therefore, the sequence control circuit 110 discontinues the imaging sequence.

Based on the above-described points, minTimeLimit, that is the time from the first temperature to the second temperature, is length of time in which the imaging is guaranteed to be possible, as the imaging sequence is started at a temperature lower than the first temperature and the imaging sequence is discontinued at the second temperature. In the case of routine examinations or imaging of many patients under the same conditions, the imaging time is set so as not to exceed minTimeLimit, whereby imaging can be performed stably regardless of the detail conditions such as the temperature at the end of shimming and/or the temperature state of the apparatus before the imaging.

In other words, the processing circuit 150 calculates, by the second calculation function 10b, the time taken for the gradient coil 102 to reach the limit temperature for imaging $Temp_{lim}$ from the acceptable temperature $Temp_{max\_st}$ for starting the imaging, thereby calculating the minimum value of the time in which the imaging can be possible satisfying a predetermined image quality. The magnetic resonance imaging apparatus 100 according to the second embodiment thus can securely perform imaging.

Third Embodiment

In the first embodiment and the second embodiment, the processing circuit 150 calculates, by the second calculation function 10b, the convergence temperature $Temp_{sat}$ at which the steady state is reached, and calculate the estimated value of the temperature of the gradient coil 102 at each time based on the calculated convergence temperature. Embodiments are not limited to this example. For example, the processing circuit 150 may directly calculate the estimated value of the temperature of the gradient coil 102 at each time by directly solving a fundamental equation, for example, the heat equation. In such a case, the processing circuit 150 calculates, by the second calculation function 10b not illustrated, the estimated value of the temperature of the gradient coil 102 at each time, by deriving the heat equation from the estimated value of the consumption energy of the gradient coil 102 at each time and solving the heat equation under a predetermined boundary condition. Here, the heat equation is a parabolic partial differential equation known as Equation (10), which is the equation used as the starting point for theoretically studying a non-uniform temperature temporal change. In Equation (10), the temperature $\theta(x, t)$ is a function of the three-dimensional position x and the time t and is the quantity representing temperature. In Equation (10), the thermal source $q(x, t)$ is a function of the three-dimensional position x and the time t and is the quantity that represents the amount of heat of the heat source located at that position in that time. In the present embodiment, $q(x, t)$ corresponds to the temporal change of the estimated value of the consumption energy of the gradient coil 102 that is calculated by the processing circuit 150 by the first calculation function 10a. The coefficient a on the left side is a predetermined coefficient called thermal diffusivity.

$$\left(\frac{\partial}{\partial t} - a\nabla^2\right)\theta(x, t) = q(x, t) \qquad (10)$$

Here, a predetermined boundary condition can be set for the heat equation to incorporate the effect of the cooling apparatus into a model of the heat equation. For example, when the rate of cooling by the coolant and the heat flux on the boundary can be regarded as constant, the processing circuit 150 can set the Neumann boundary condition as the boundary condition of the heat equation. When the heat capacity of the coolant can be regarded as sufficiently large and the temperature on the boundary can be regarded as constant, the processing circuit 150 can set the Dirichlet boundary condition as the boundary condition of the heat equation. The processing circuit 150 can set a mixed boundary condition as the boundary condition of the heat equation, if necessary.

The effect of the cooling apparatus may be embodied in a multi-layer model. For example, the processing circuit 150 may construct a model including a first layer of the coolant (water) and a second layer including the others and solve the model under the predetermined boundary condition.

Once the boundary condition is specified in this manner, the solution of the heat equation in Equation (10) can be obtained, for example, using the Green's function that is the inverse operator of the operator of the left side of Equation (10). In particular, with the Green's function in a case where high symmetry such as cylindrical symmetry exists on the boundary, the problem is simplified, and the processing circuit 150 can derive a certain formula, for example, using Bessel functions. Assuming that the bore has a cylindrical shape, the processing circuit 150 can obtain the solution of the heat equation in Equation (10) rigorously by a predetermined method. This is also applicable to a bore having an oval shape.

When the boundary shape has a low symmetry, for example, not having the cylindrical symmetry, the processing circuit 150 may solve the differential equation in Equation (10) using numerical simulations such as the difference methods and the finite element method. Alternatively, the processing circuit 150 may solve the heat equation by perform the Fourier transformation to Equation (10).

When calculating the estimated value of the temperature of the gradient coil 102 at each time as the solution of the heat equation by an analytical approach or a numerical approach in this manner, the processing circuit 150 may calculate, by the second calculation function 10b, the parameters in Equation (5) or Equation (6) based on the calculated estimated value. For example, the processing circuit 150 may calculate, by the second calculation function 10b, the coefficient α in Equation (5), the matrix β={βij} in Equation (5), Temp$_{sat}$ in Equation (6), the constant α in Equation (6), and the like, on the basis of the solution of the heat equation. The processing circuit 150 further performs, by the second calculation function 10b, step S102 to step S105 in FIG. 2 using the thus calculated parameters, for imaging sequences including an imaging sequence other than the imaging sequence for which the solution of the heat equation has been calculated, to calculate the estimated value of the temperature of the gradient coil 102 at each time.

As described above, for example, first, the processing circuit 150 solves, by the second calculation function 10b, the heat equation that is a fundamental equation, with a data set of a predetermined preliminary imaging sequence. Next, the processing circuit 150 calculates a predetermined parameter to be used by the second calculation function 10b to calculate the estimated value of the temperature of the gradient coil 102 at each time, based on the obtained solution of the heat equation. Finally, the processing circuit 150 calculates, by the second calculation function 10b, the estimated value of the temperature of the gradient coil 102 at each time for imaging sequences including an imaging sequence other than the preliminary imaging sequence, based on the calculated parameter. The processing circuit 150 thus calculates the estimated value of the temperature of the gradient coil 102 at each time with a method demanding less computational load using a parameter calculated using the more elaborate method. The processing circuit 150 thus achieves a good balance between reduction of the time taken to calculate the estimated value of the temperature of the gradient coil 102 at each time and the computation precision.

The instructions illustrated in the process procedure in the foregoing embodiments can be executed based on a software program. A general-purpose calculator system may store this program in advance and read the program to achieve the same effects as the effects achieved by the magnetic resonance imaging apparatus 100 in the foregoing embodiments. The instructions described in the foregoing embodiments are recorded in the form of a computer-executable program on a magnetic disk (for example, a flexible disk or a hard disk), an optical disk (for example, a CD-ROM, a CD-R, a CD-RW, a DVD-ROM, a DVD±R, or a DVD±RW), a semiconductor memory, or any similar recording medium. The storage format of the storage medium may be any format readable by a computer or a built-in system. A computer can read the program from the recording medium and execute the instructions written in the program on the processor based on the program to implement the same operation as in the magnetic resonance imaging apparatus 100 in the foregoing embodiments. The computer may acquire or read the program via a network, as a matter of course.

For example, an operating system (OS) running on a computer, a database management system, or middleware (MW) for networks may execute part of the processing for implementing the foregoing embodiments, based on the instructions in the program installed in a computer or a built-in system from a recording medium.

The term "recording medium" is intended to include a medium independent of a computer or a built-in system as well as a recording medium that stores or temporarily stores the program transmitted and downloaded via a local area network (LAN), the Internet, or the like.

The term "recording medium" in embodiments is intended to include a single recording medium as well as a plurality of recording media from which the processing in the foregoing embodiments is performed. The medium may have any configuration.

The computer or the built-in system in embodiments is intended for executing each processing in the foregoing embodiments, based on the program stored in a recording medium, and may be a one-piece device such as a personal computer or a microcomputer, a system including a plurality of devices connected to a network, or any other configuration.

The term "computer" in embodiments includes a personal computer as well as a processor or a microcomputer included in information processing equipment and collectively refers to equipment or apparatus capable of implementing the functions in embodiments by programs.

The magnetic resonance imaging apparatus according to at least one of the foregoing embodiments can estimate the temperature of the gradient coil in accordance with an imaging sequence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
a temperature sensor configured to acquire a temperature; and
a processing circuit configured to
calculate, based on information on an imaging sequence in which magnetic resonance imaging is to be performed, an estimated value of a consumption energy of a gradient coil when the imaging sequence is executed; and
calculate, based on the temperature acquired by the temperature sensor and the estimated value of the consumption energy, an estimated value of a temperature of the gradient coil, the temperature of the gradient coil undergoing changes as the imaging sequence is executed,
wherein the processing circuit is further configured to calculate the estimated value of the temperature of the gradient coil based on a magnitude of interaction between conductor patterns of X-axis, Y-axis, and Z-axis gradient coils.

2. The magnetic resonance imaging apparatus according to claim 1, wherein the processing circuit is further configured to calculate, based on the temperature acquired by the temperature sensor and the estimated value of the consumption energy, a time taken for the gradient coil to reach a second temperature from a first temperature.

3. The magnetic resonance imaging apparatus according to claim 2, wherein the first temperature is an acceptable temperature for starting imaging and the second temperature is a limit temperature for imaging, the acceptable temperature for starting imaging being a predetermined temperature determined as a maximum temperature on which the imaging sequence can be initiated, the limit temperature for imaging being a predetermined temperature determined as a maximum temperature on which the imaging sequence can be continued, and the processing circuit is further configured to calculate a time taken for the gradient to coil to reach the limit temperature for imaging from the acceptable temperature for starting the imaging, thereby calculating a minimum value of a time in which imaging can be possible to satisfy a predetermined image quality.

4. The magnetic resonance imaging apparatus according to claim 1, wherein the processing circuit is further configured to estimate consumption energy of X-axis, Y-axis, and Z-axis gradient coils.

5. The magnetic resonance imaging apparatus according to claim 1, wherein the processing circuit is further configured to calculate, based on the temperature acquired by the temperature sensor and the estimated value of the consumption energy, an estimated value of a convergence temperature, and calculate, based on the estimate value of the convergence temperature, the estimated value of the temperature of the gradient coil, the convergence temperature being a temperature to which the temperature converges when the imaging sequence is kept executed.

6. The magnetic resonance imaging apparatus according to claim 5, wherein the processing circuit is further configured to calculate, based on a linear sum of estimated values of consumption energy of the X-axis, Y-axis, and Z-axis gradient coils and certain coefficients specified based on an arrangement of the gradient coils, an estimated value of a temperature increase, and calculate, based on the estimated value of the temperature increase, the estimated value of the convergence temperature.

7. The magnetic resonance imaging apparatus according to claim 5, wherein the processing circuit is further configured to determine, prior to an execution of the imaging sequence, whether it is acceptable to execute the imaging sequence or not, the apparatus further comprises a sequence control circuit configured to execute the imaging sequence when the processing circuit determines that it is acceptable to execute the imaging sequence, and the processing circuit is further configured to determine that it is acceptable to execute the imaging sequence when the convergence temperature is lower than a predetermined temperature.

8. The magnetic resonance imaging apparatus according to claim 1, wherein the processing circuit is further configured to calculate an estimated value of a temperature at a point of time when the execution of the imaging sequence is finished.

9. The magnetic resonance imaging apparatus according to claim 8, wherein the processing circuit is further configured to determine, prior to an execution of the imaging sequence, whether it is acceptable to execute the imaging sequence, the apparatus further comprises a sequence control circuit configured to execute the imaging sequence when the processing circuit determines that it is acceptable to execute the imaging sequence or not, and the processing circuit is further configured to determine that it is acceptable to execute the imaging sequence, when the estimated value of the temperature at the point of time when the execution of the imaging sequence is finished is lower than a certain temperature.

10. The magnetic resonance imaging apparatus according to claim 1, wherein the processing circuit is further configured to derive a heat equation from the estimated value of the consumption energy of the gradient coil at each time, and solve the heat equation under a certain boundary condition, thereby calculating the estimated value of the temperature of the gradient coil.

11. The magnetic resonance imaging apparatus according to claim 1, wherein the processing circuit is further configured to calculate, based on information on the imaging sequence by using an equivalent circuit, a value of a current, and calculate, based on the value of the current, a temporal change of the estimated value of the consumption energy of the gradient coil, the equivalent circuit is an equivalent circuit for a circuit including the gradient coil and having a first circuit and a second circuit, the first circuit being connected to a power supply and having self-inductance, the second circuit including at least one closed circuit having mutual inductance with the first circuit, and the current flows through the closed circuit.

12. A magnetic resonance imaging method executed in a magnetic resonance imaging apparatus, the magnetic resonance imaging method comprising:

acquiring a temperature;

calculating, based on information on an imaging sequence in which magnetic resonance imaging is to be performed, an estimated value of consumption energy of a gradient coil when the imaging sequence is executed; and calculating, based on the temperature and the estimated value of the consumption energy, an estimated value of a temperature of the gradient coil, the temperature of the gradient coil undergoing changes as the imaging sequence is executed, wherein the step of calculating the estimated value of the temperature of the gradient coil comprises calculating the estimated value of the temperature of the gradient coil based on a magnitude of interaction between conductor patterns of X-axis, Y-axis, and Z-axis gradient coils.

* * * * *